United States Patent [19]

Goff et al.

[11] Patent Number: 4,931,745

[45] Date of Patent: Jun. 5, 1990

[54] LOW NOISE CHOPPER STABILIZED AMPLIFIER AND METHOD OF OPERATION

[75] Inventors: Larry Goff, Dallas, Tex.; Lawrence A. King, Durham, N.C.; Daniel B. Barnett; Samuel P. Justice, both of Garland, Tex.

[73] Assignee: Texas Instruments Incorporated, Dallas, Tex.

[21] Appl. No.: 288,503

[22] Filed: Dec. 22, 1988

[51] Int. Cl.$^5$ .......................... H03F 1/02; H03F 1/14
[52] U.S. Cl. .......................................... 330/9; 330/51
[58] Field of Search ................ 307/240, 241, ; 330/9, 330/51, 107, 109

[56] References Cited

U.S. PATENT DOCUMENTS 4,048,574  9/1977  Barbier et al. ........................... 330/9
4,450,368  5/1984  Spence ................................. 330/9 X

OTHER PUBLICATIONS

Maxim Data Book, p. 7, published in 1986, "±15 Volt Chopper Stabilized Operational Amplifier".
Linear Technology Data Book, p. 11, (published date unknown), "TC1052/LTC7652".
Intersil Data Book, p. 5-92, (published date unknown), "ICL7650".

Primary Examiner—Steven Mottola
Attorney, Agent, or Firm—B. Peter Barndt; James T. Comfort; Melvin Sharp

[57] ABSTRACT

A chopper op amp (10) is provided having an input chopping waveform (70). Input chopping waveform E (70) is used to generate waveform C (76) and waveform D (78) for activating switch C (36) and switch D (38), respectively. The high period of waveforms C (76) and D (78) are reduced relative to the chopping waveform (70), thereby corresponding to a reduced duty cycle for chopper op amp (10). The period (88, 90) of chopping waveform (70) may be reduced below two milliseconds.

27 Claims, 2 Drawing Sheets

LOW NOISE CHOPPER STABILIZED AMPLIFIER AND METHOD OF OPERATION

TECHNICAL FIELD OF THE INVENTION

This invention relates to operational amplifiers, and more particularly to an optimization construction and operation of low noise chopper stabilized amplifiers.

BACKGROUND OF THE INVENTION

Chopper stabilized operational amplifiers (op amps) reduce DC input offset voltages. These characteristics make chopper op amps ideal for precision, low frequency applications such as strain gauge and thermocouple amplifiers. However, problems associated with noise and aliasing arise when current chopper op amps are used in higher frequency applications.

Op amps commercially available today use internal chopping frequencies in the range of 100 Hz to 400 Hz to ensure low DC input offset voltages on the order of 5 microvolts or less. The use of a chopping frequency tends to limit the application of the op amp to input signal frequencies up to one-half of the chopping frequency. At input frequencies higher than one-half of the chopping frequency, aliasing problems occur. Aliasing is the result of large noise spikes which occur at harmonics of the summation of, and difference between, the chopping frequency and the input frequency. For example, for an op amp which chops at a frequency of 500 Hz, an input frequency of 200 Hz, will give rise to an aliasing spike at 300 Hz and 700 Hz, and harmonics thereof.

Commercially available chopper op amps also often actually increase noise over linear op amps when used in applications above 10 Hz. Thus, while noise is reduced with the use of chopper op amp below 10 Hz, increases in frequencies beyond the 10 Hz spectrum bring an increase in noise level associated with the amplified signal.

Therefore, a need has arisen for a chopper op amp which may be utilized in larger frequency bandwidth applications while ameliorating aliasing problems and reducing noise associated with the chopper op amp output.

SUMMARY OF THE INVENTION

In accordance with the present invention, a configuration and operation for a chopper stabilized op amp is provided which substantially eliminates or reduces disadvantages and problems associated with prior chopper op amps.

A chopper op amp in accordance with the present invention includes both a nulling and a main amplifier. The chopper op amp topology uses nulling voltages to correct DC errors within the nulling and main amplifiers. The chopper op amp operates over a clock period wherein a first phase is associated with correcting DC errors in the nulling amplifier. A second clock period also includes a second phase associated with correcting DC errors in the main amplifier. The duty cycle of each correcting phase with respect to the corresponding clock period is maintained below twenty percent (20%). Positive noise improvements are effected by steadily reducing the duty cycle toward zero percent (0%). A higher chopping frequency (i.e. shorter clock period) is also utilized to minimize aliasing problems associated with prior chopper op amps.

The present invention provides the technical advantage of maintaining low offset voltages while reducing input referred noise. Another important technical advantage of the present invention includes increased bandwidth for higher frequency applications of the chopper op amp, thereby eliminating aliasing problems typically incurred at higher frequencies. The present invention has another important aspect in that output noise levels are reduced throughout an increased bandwidth, and therefore the scope of potential uses for chopper op amps is significantly increased.

BRIEF DESCRIPTION OF THE DRAWINGS

For a more complete understanding of the present invention and for further advantages thereof, reference is now made to the following Detailed Description, taken in conjunction with the accompanying drawings, in which.

DETAILED DESCRIPTION OF THE INVENTION

Figure 1:
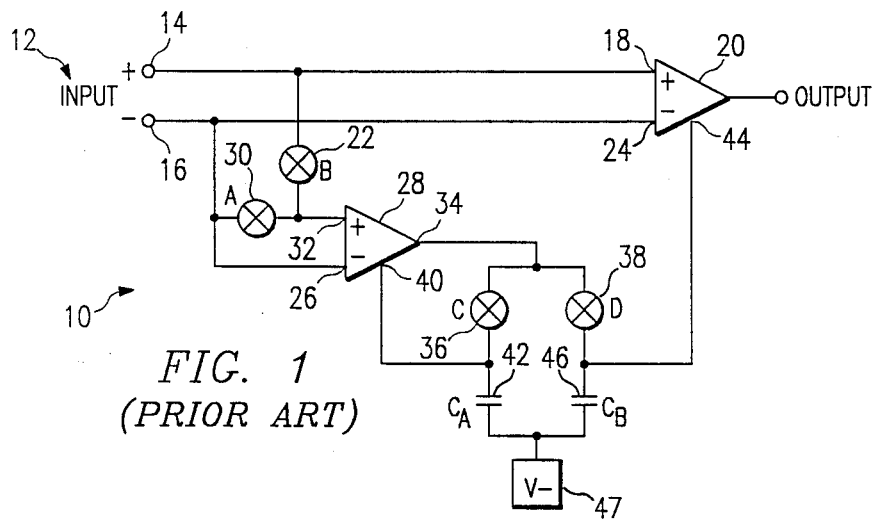
FIG. 1 illustrates a common scheme for prior chopper op amp topologies.

FIG. 1 illustrates a typical construction for a prior art chopper op amp 10 topology. Chopper op amp 10 has an input 12 comprising both a positive input 14 and a negative input 16. Positive input 14 is coupled to the positive input 18 of the main amplifier 20 as well as to switch B 22. Negative input 16 is connected to negative input 24 of main amplifier 20. Negative input 16 is further connected to negative input 26 of nulling amplifier 28, as well as to switch A 30. Both switch A 30 and switch B 22 are connected to the positive input 32 of nulling amplifier 28. The output 34 of nulling amplifier 28 is connected to both switch C 36 and switch D 38. Switch C 36 is connected to the null pin 40 of nulling amplifier 28, as well as to external capacitor $C_A$ 42. Switch D 38 is connected to the null pin 44 of main amplifier 20 and to external capacitor $C_B$ 46. Switches A 30, B 22, C 36 and D 38 may be simple transistor switches, such as CMOS transistors or the like, or any other suitable electronic switches. Both capacitors $C_A$ 42 and $C_B$ 46 are connected to a negative supply voltage 47 for chopper op amp 10.

Two phases are normally included in the operation of chopper op amp 10. In a first nulling phase, switch A 30 and switch C 36 are closed while switch B 22 and switch D 38 are held open. As a result, positive input 32 and negative input 26 of nulling amplifier 28 are tied together, thereby creating a zero differential input signal. The output 34 of nulling amplifier 28 will therefore comprise the open loop gain thereof multiplied by the magnitude of the inherent offset voltage within nulling amplifier 28. Because switch C 36 is closed, this output signal will be directly coupled to null pin 40 of nulling amplifier 28, thereby causing that amplifier to null its own offset voltages. Further, this output signal will be stored on capacitor $C_A$ 42.

In a second amplifying phase of chopper op amp 10, switch A 30 and switch C 36 are opened, while switch B 22 and switch D 38 are closed. As a result, nulling amplifier 28 is placed in parallel with the input stage of main amplifier 20. The output 34 of nulling amplifier 28 will now represent amplification of the input 12 signal. Because switch D 38 is closed, output 34 signal will be directly coupled to null pin 44 of main amplifier 20. Because of the internal staging of main amplifier 20, this direct connection will cause main amplifier 20 to null its own offset voltages while also acting in parallel amplification with nulling amplifier 28. Further, output 34 of nulling amplifier 28 will be stored on capacitor $C_B$ 46.

The DC offset correction signals stored on capacitors $C_A$ 42 and $C_B$ 46 are used to maintain nulling offset signals during time periods where there is no direct nulling from null amplifier output 34 to either null pin 40 or 44. Again, during the nulling phase, switch C 36 is closed while switch D 38 is opened. Thus, during the nulling phase, capacitor $C_B$ 46 is directly coupled to null pin 44 of main amplifier 20, and therefore maintains a nulling voltage signal at that pin. Conversely, during the amplifying phase, switch C 36 is opened while switch D 38 is closed. Here, capacitor $C_A$ 42 is directly coupled to null pin 40 of nulling amplifier 28 and therefore maintains a nulling signal at that pin.

It may be readily appreciated that chopper op amp 10 cycles alternatively between a nulling phase and an amplification phase to correct offset DC voltages within its component amplifiers. Capacitance values for capacitors $C_A$ 42 and $C_B$ 46 should be chosen large enough to maintain charges stored thereon during time periods where there is no direct coupling to a nulling offset signal. Typical capacitance values are on the order of 1 $\mu$F, but may be as low as 0.1 $\mu$F. For additional detail regarding prior chopper op amp construction and operation, reference is made to the *Linear Technology Databook*, 1986 ed., pp. 2-128 to 2-129 on chopping topologies, which is incorporated herein by reference.

While FIG. 1 depicts only a single main amplifier 20 and a single nulling amplifier 28, it is to be understood that these amplifiers may be replaced by complete amplification stages serving the same chopping purpose. The use of single amplifiers is merely illustrative and Applicant fully intends to emcompass alternative chopping topologies within its invention.

Figure 2:
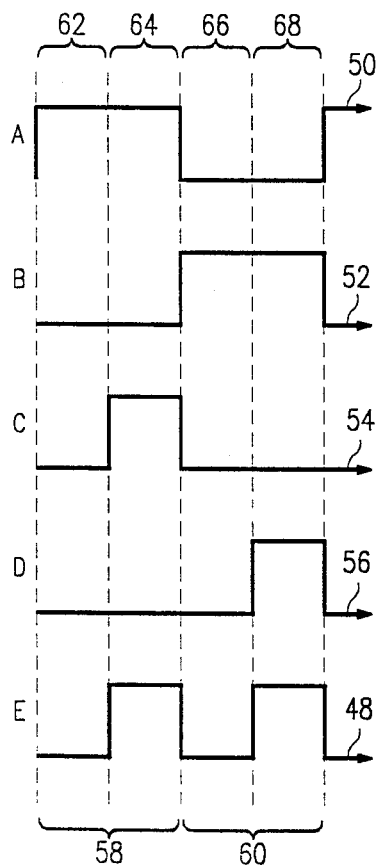
FIG. 2 illustrates a timing diagram associated with prior chopper op amp topologies.

FIG. 2 illustrates a timing diagram for prior art operation of chopper op amp 10 of FIG. 1. More particularly, an input chopping waveform 48 is shown in relation to the four signals which are applied to switches A 30, B 22, C 36 and D 38, respectively. Input chopping waveform 48 is generated by a suitable clock and transformed by conventional circuitry into four separate waveforms: waveform 50, waveform 52, waveform 54 and waveform 56. Both a first period 58 and second period 60 must pass in time to complete one nulling and amplifying cycle for chopper op amp 10. During that cycle, there are four distinct phases: first phase 62, second phase 64, third phase 66 and fourth phase 68.

It may now be readily appreciated that second phase 64 is the nulling phase previously mentioned in connection in operation of chopper op amp 10. As mentioned above, during the nulling phase, switch A 30 and switch C 36 are closed because waveform 50 and waveform 54 are both high. Further, the aforementioned amplification phase corresponds to fourth phase 68, wherein switch B 22 and switch D 38 are closed. Accordingly, in FIG. 2 during fourth phase 68, waveform 52 and waveform 56 are both high.

It may be seen that both waveform 54 and waveform 56 are high during 50% of the corresponding periods 58 and 60 of waveform 48. This percentage is known in the art as the duty cycle of the waveforms. More particularly, the duty cycle as pertaining to chopper Op amps is defined as the time which either switch C 36 or switch D 38 is closed, relative to the corresponding clock periods 58 and 60, respectively. As disclosed in the earlier noted *Linear Technology Databook*, and in data sheets pertaining to other prior topologies, previously developed chopper op amps preferably use a 30% to 80% duty cycle. Thus, either switch C 36 or switch D 38 are closed from 30-80% under the prior art. However, such prior art devices did not recognize the inventive concept of the present invention wherein substantially reducing the duty cycle to less than 20% greatly enhances the noise associated with the op amp output.

Under the prior art duty cycles above 20%, noise problems associated with the chopper op amp output have limited the applicable bandwidth of the chopper op amp. Noise levels have been such that the op amp may be used only for low frequency applications. As the frequency of the input signal increased, noise associated with the output became too high for applications above several hundred hertz. Further, prior chopper op amps were generally limited to chopping frequencies below 500 Hz. Since aliasing problems occur generally above one-half of the chopping frequency, this further limited the use of the chopper to input applications below 250 Hz.

In both first phase 62 and third phase 66, there is no direct coupling between output 34 of null amplifier 28 and either null pin 40 or 44. During first phase 62, waveforms 52, 54, 56 and 58 are such that switch A 30 is closed, while switches B 22, C 36 and D 38 are open. As a result, capacitor $C_A$ 42 maintains nulling at null pin 40 while capacitor $C_B$ 46 maintains nulling at null pin 44. Similarly, during third phase 66, switch B 22 is closed while switches A 30, C 36 and D 38 are again open. Thus, again there is maintained nulling by capacitors $C_A$ 42 and $C_B$ 46.

Figure 3:
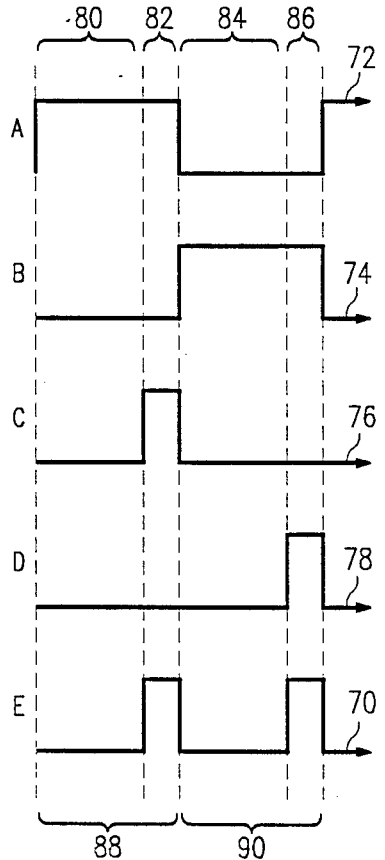
FIG. 3 illustrates a timing diagram for the operation of the present invention.

FIG. 3 illustrates a timing diagram for the electrical waveforms generated for a chopper op amp 10 using the present invention. An input chopping waveform 70 is generated by a clock to drive the switches associated with chopper op amp 10. Input chopping waveform 70 may be generated by an internal clock, or clocked in from an external source to a clock pin on the chopper op amp package. Waveform 72 and waveform 74 operate in a similar fashion as waveforms 50 and 52 (FIG. 2). However, waveform 76 and waveform 78 are generated in accordance with the present invention in order to provide duty cycles of 20% or less, which in turn results in much lower noise. Four phases 80, 82, 84 and 86 occur over a first period 88 and second period 90 of input chopping waveform 70. Second phase 82 corresponds to the nulling phase of chopper op amp 10, while fourth phase 86 corresponds to the amplifying phase of chopper op amp 10.

As illustrated in FIG. 3, the duration of the high period of waveform 76 and waveform 78 has been reduced relative to first period 88 and second period 90 of input chopping waveform E 70. Thus, there is a reduced duty cycle for chopper op amp 10. This reduced duty cycle has shown positive improvements in the reduction of noise in using a chopper op amp in increased bandwidth applications.

In accordance with the present invention, substantial improvements in noise occur when op amp 10 is operated with duty cycles of less than 20%. Preferably, the duty cycle is reduced to below 5%, with continued noise improvement being noted as the duty cycle approaches 0%. In accordance with the invention, the duty cycle is thus reduced as much as possible. This improvement in noise occurs because the overall duration of direct coupling of nulling amplifier 28 to null pins 40 and 44 is reduced. As such, there is less time for the occurrence of internal noise fluctuations which normally may occur during direct coupling nulling.

Figure 4:
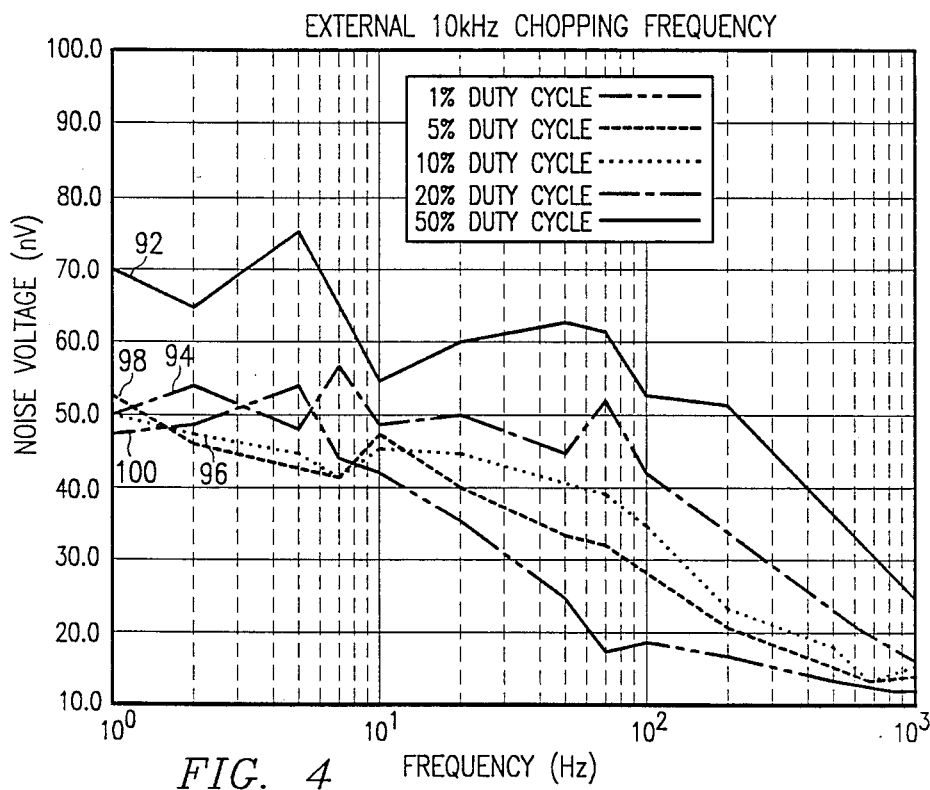
FIG. 4 illustrates a comparison graph of response curves for prior chopper op amps versus those of the present invention.

FIG. 4 illustrates the response curve for chopper op amp 10, driven with five chopping waveforms of different duty cycles at a chopping frequency of 10 kHz. The graph illustrates response in nanovolts as frequency in Hertz increases. Response line 92 represents the current existing art for the chopper op amp operating at the conventional 50% duty cycle. Similarly, response lines 94, 96, 98 and 100 represent chopper op amp noise levels at duty cycles of 20%, 10%, 5% and 1%, respectively. It may be readily appreciated that each reduction in duty cycle has a corresponding reduction in noise level associated with the chopper op amp. Therefore, optimal noise conditions are attained as the duty cycle approaches 0%.

Figure 5:
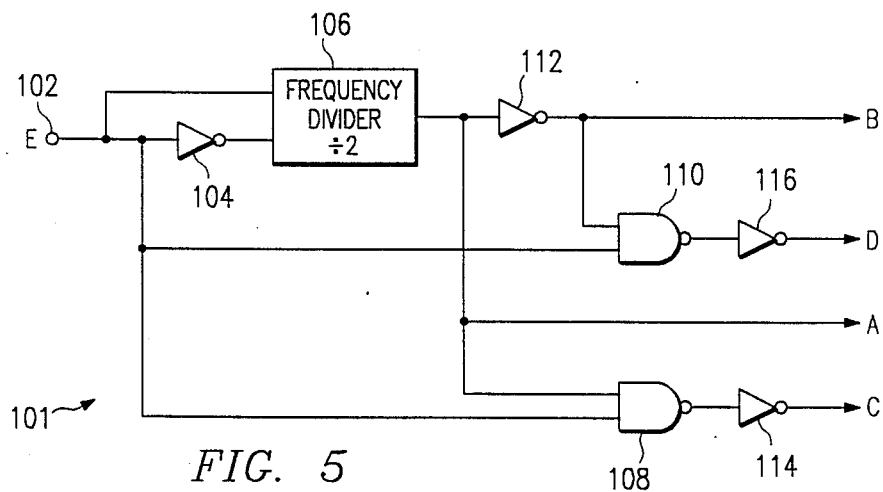
FIG. 5 illustrates circuitry for generating the waveforms illustrated in FIG. 3.

FIG. 5 illustrates circuitry 101 for generating the waveforms illustrated in FIG. 3. Input 102 is connected to an inverter 104, a frequency divider 106, a NAND gate 108 and a NAND gate 110. The output of inverter 104 is connected to frequency divider 106. The output of frequency divider 106 is connected to inverter 112 and NAND gate 108. The output of NAND gate 108 is connected to an inverter 114. The output of inverter 112 is connected to NAND gate 110. The output of NAND gate 110 is connected to an inverter 116.

In operation of circuitry 101, the input 102 receives a waveform 70 which may be generated by an on-chip internal oscillator, or received from a clock pin provided on the chopper op amp package. The output of frequency divider 106 represents waveform 72 for controlling switch A 30 (FIG. 1). The output of inverter 112 represents waveform 74 utilized for controlling switch B 22 in the chopper op amp topology. The output of inverter 116 represents waveform 78 utilized to control switch D 38. The output of inverter 114 represents the switching waveform 76 for switch C 36. Accordingly, the logic characteristics known in the art and associated with the various devices of circuitry 101 combine to generate the waveforms of FIG. 3. The elements within circuitry 101 may be varied to create reduced duty cycles, and to substantially approach a 0% duty cycle.

The present invention thus provides substantially enhanced noise performance for chopper op amps, thereby increasing the usefulness of such op amps at higher frequencies by reducing the duty cycle.

Another aspect of the present invention involves variation in the frequency of the chopping waveform. Currently available chopping op amps typically use a chopping frequency of approximately 500 Hz, thereby corresponding to a chopping period of 2 milliseconds. Aliasing problems result when the input signal frequency approaches one-half of the chopping frequency. Therefore, the use of prior chopping op amps has tended to be limited to input frequency applications of under 250 Hz, that is, one-half of the prior chopping frequency. The reduction of noise under the present invention is associated with the use of much higher chopping frequencies. As a result, chopping frequencies from 500 Hz (period of two milliseconds) to 20 kHz (period of fifty microseconds) may be used with the present invention with improvement over the noise problems previously associated with the 50% duty cycle chopping amplifiers. Indeed, the response curves illustrated in FIG. 4 were determined at a chopping frequency of 10 kHz. Consequently the present invention substantially reduces aliasing problems heretofore encountered with conventional chopper op amps.

Although the present invention has been described in detail, it should be understood that various changes, substitutions and alterations can be made hereto without departing from the spirit and scope of the invention as defined by the appended claims.

What is claimed is:

1. A chopper stabilized amplifier cycling at a clock period, comprising:
   a nulling amplifier;
   a main amplifier associated with said nulling amplifier to form the chopper stabilized amplifier;
   circuitry for generating a clock period including a first clock phase for correcting DC errors in said main amplifier, said first clock phase having a duration less than 20% of the clock period.

2. The chopper stabilized amplifier of claim 1 wherein said clock period includes a second clock phase for correcting DC errors in said nulling amplifier, said second clock phase of a duration less than 20% of the clock period.

3. The chopper stabilized amplifier of claim 1 and further including a plurality of switches for operating said nulling amplifier and said main amplifier in accordance with said first and second clock phases.

4. The chopper stabilized amplifier of claim 3 wherein said switches comprise transistor switches.

5. A chopper stabilized amplifier cycling at a clock period, comprising:
   a nulling amplifier;
   a main amplifier associated with said nulling amplifier to form the chopper stabilized amplifier; and
   circuitry for generating a clock period including a first clock phase for correcting DC errors in said main amplifier, and a second clock phase for correcting DC errors in said nulling amplifier, the first clock phase being of a duration less than or equal to 5% of the clock period, and the second clock phase being of a duration less than or equal to 5% of the clock period.

6. The chopper stabilized amplifier of claim 5, wherein the duration of said first clock phase substantially approaches zero percent of the clock period, and the duration of said second clock phase substantially approaches zero percent of the clock period.

7. The chopper stabilized amplifier of claim 1 wherein the clock period is less than two milliseconds.

8. A chopper stabilized amplifier having a clock operating over a clock period, comprising:
   a nulling amplifier;
   a main amplifier;
   a first clock phase for correcting DC errors in said nulling amplifier, said first clock phase occurring for a time less than 20% of the clock period; and a second clock phase for correcting DC errors in said main amplifier, said second clock phase occurring for for a time less than 20% of the clock period.

9. The chopper stabilized amplifier of claim 8 and further including transistor switches for operating said nulling amplifier and said main amplifier in accordance with said first and second clock phases.

10. The chopper stabilized amplifier of claim 8 and further comprising:
a first capacitor associated with said nulling amplifier for correcting DC errors of said nulling amplifier; and
a second capacitor associated with said main amplifier for correcting DC errors of said main amplifier.

11. The chopper stabilized amplifier of claim 8 wherein the clock period is substantially less than two milliseconds.

12. A chopper stabilized amplifier cycling at a clock period comprising:
a nulling amplifier;
a main amplifier;
a first clock period including a first clock phase for correcting DC errors in said nulling amplifier, said first clock phase having a duration less than 20% of the first clock period;
a second clock phase for correcting DC errors in said main amplifier, said second clock phase having a duration less than 20% of the first clock period; and
said clock period being less than two milliseconds in order to reduce aliasing problems.

13. The chopper stabilized amplifier of claim 12 and further including a clock period between fifty microseconds and two milliseconds.

14. A method for amplifying an electrical signal with a chopper stabilized amplifier including a nulling amplifier and a main amplifier, comprising:
inputting the electrical signal into the chopper stabilized amplifier;
clocking the chopper stabilized amplifier over a clock period having a first phase;
clocking the chopper stabilized amplifier over a clock period having a second phase; and
maintaining said first phase for a time period shorter than 20% of said clock period.

15. The method for amplifying an electrical signal with a chopper stabilized amplifier of claim 14, and further including maintaining said second phase for a time period shorter than 20% of said clock period.

16. A method for amplifying an electrical signal with a chopper stabilized amplifier including a nulling amplifier and a main amplifier, comprising:
inputting the electrical signal into the chopper stabilized amplifier;
clocking the chopper stabilized amplifier over a clock period having a first phase;
clocking the chopper stabilized amplifier over a clock period having a second phase;
maintaining said first phase for a time period equal to or less than five percent of said clock period; and
maintaining said second phase for a time period equal to or less than five percent of said clock period.

17. The method for amplifying an electrical signal with a chopper stabilized amplifier of claim 14, and further comprising:
correcting the DC errors of the nulling amplifier with a null voltage; and
correcting the DC errors of the main amplifier with a null voltage.

18. The method for amplifying an electrical signal with a chopper stabilized amplifier of claim 17, wherein said correcting steps further include storing said null voltages on capacitors associated with the nulling amplifier and the main amplifier.

19. The method for amplifying an electrical signal with a chopper stabilized amplifier of claim 14, and further including maintaining said clock period for a time substantially less than two milliseconds.

20. A method for amplifying an electrical signal with a chopper stabilized amplifier including a nulling amplifier and a main amplifier, comprising:
inputting the electrical signal into the chopper stabilized amplifier;
clocking the chopper stabilized amplifier over two clock periods, a first period having a first phase and a second period having a second phase; and
maintaining said first phase for a time period shorter than 20% of said clock period.

21. The method for amplifying an electrical signal with a chopper stabilized amplifier of claim 20, and further including maintaining said second phase for a time period shorter than 20% of said clock period.

22. The method for amplifying an electrical signal with a chopper stabilized amplifier of claim 20 and further including switching DC offset correction signals in accordance with said first and second clock phases.

23. The method for amplifying an electrical signal with a chopper stabilized amplifier of claim 20 and further including storing DC offset correction signals on capacitors associated with the nulling amplifier and the main amplifier.

24. A method for amplifying an electrical signal with a chopper stabilized amplifier including a nulling amplifier and a main amplifier, comprising:
inputting the electrical signal into the chopper stabilized amplifier;
clocking the chopper stabilized amplifier over two clock periods, a first clock period having a first phase and a second clock period having a second phase; and
maintaining said first phase and said second phase for a time period equal to or less than five percent of one of said clock periods.

25. The method for amplifying an electrical signal with a chopper stabilized amplifier of claim 20 and further including maintaining the clock period for a time substantially less than two milliseconds.

26. A method for amplifying an electrical signal with a chopper stabilized amplifier including a nulling amplifier and a main amplifier, comprising:
inputting the electrical signal into the chopper stabilized amplifier;
clocking the chopper stabilized amplifier over a two clock periods, a first clock period having a first phase and a second clock period having a second phase;
maintaining said clock period for a time shorter than two milliseconds; and
maintaining said first phase and said second phase for a time equal to or less than five percent of one of said first clock period or said second clock period.

27. The method for amplifying an electrical signal with a chopper stabilized amplifier of claim 26 and further including maintaining said clock period between fifty microseconds and two milliseconds.

* * * * *